United States Patent
Cho et al.

(10) Patent No.: US 11,901,394 B2
(45) Date of Patent: Feb. 13, 2024

(54) DISPLAY PANEL AND MANUFACTURING METHOD THEREFOR

(71) Applicants: Beihai HKC Optoelectronics Technology Co., Ltd., Beihai (CN); HKC Corporation Limited, Shenzhen (CN)

(72) Inventors: En-Tsung Cho, Beihai (CN); Jie Ding, Beihai (CN); Je-Hao Hsu, Beihai (CN); Lidan Ye, Beihai (CN)

(73) Assignees: BEIHAI HKC OPTOELECTRONICS TECHNOLOGY CO., LTD., Beihai (CN); HKC CORPORATION LIMITED, Shenzhen (CN)

( * ) Notice: Subject to any disclaimer, the term of this patent is extended or adjusted under 35 U.S.C. 154(b) by 356 days.

(21) Appl. No.: 17/358,012

(22) Filed: Jun. 25, 2021

(65) Prior Publication Data

US 2022/0037392 A1  Feb. 3, 2022

(30) Foreign Application Priority Data

Jul. 29, 2020 (CN) .......................... 202010742447.1

(51) Int. Cl.
| | |
|---|---|
| *H10K 59/65* | (2023.01) |
| *H01L 27/146* | (2006.01) |
| *G06V 40/13* | (2022.01) |
| *C25D 11/08* | (2006.01) |
| *C25D 11/12* | (2006.01) |

(52) U.S. Cl.
CPC ........ *H01L 27/14685* (2013.01); *C25D 11/08* (2013.01); *C25D 11/12* (2013.01); *G06V 40/1318* (2022.01); *H01L 27/14625* (2013.01); *H10K 59/65* (2023.02)

(58) Field of Classification Search
CPC ...................................................... H10K 59/65
See application file for complete search history.

(56) References Cited

U.S. PATENT DOCUMENTS

| | | | |
|---|---|---|---|
| 2014/0340912 A1 | 11/2014 | Kang et al. | |
| 2020/0065545 A1* | 2/2020 | Ahn | G06V 40/1318 |

FOREIGN PATENT DOCUMENTS

| | | |
|---|---|---|
| CN | 106886767 A | 6/2017 |
| TW | 201734574 A | 10/2017 |

* cited by examiner

*Primary Examiner* — Jae Lee

(57) ABSTRACT

The present application discloses a display panel and a manufacturing method therefor, and the method includes steps of: forming a photosensitive element layer, forming a light collimating layer on the photosensitive element layer, and forming an active light-emitting matrix layer on the light collimating layer; where the step of forming the light collimating layer includes: providing a metal substrate, putting the metal substrate into an electrolyte, and preparing a porous oxidized metal as the light collimating layer by a two-step oxidation method.

15 Claims, 4 Drawing Sheets

DISPLAY PANEL AND MANUFACTURING METHOD THEREFOR

The present application claims priority to Chinese Patent Application No. 202010742447.1, filed Jul. 29, 2020, which is hereby incorporated by reference herein as if set forth in its entirety.

TECHNICAL FIELD

The present application relates to the field of display technologies, and particularly to a display panel and a manufacturing method therefor.

BACKGROUND

The statements herein merely provide background information related to the present application and do not necessarily constitute the conventional art.

With the development of multimedia technology, touch technology has become a hot technology in current human-computer interaction. Optical touch technology is another mainstream touch technology in addition to touch technologies such as resistance touch technology and capacitance touch technology, and an optical sensor can quickly respond to detailed actions and can be applied to various places and industries such as conference places, business exhibition places, education and training places, exhibition and presentation, financial industry and troops. Optical touch from afar is generally represented by illuminating a finger with a light source to cause reflection and receiving by a sensing element to identify the specific position of the touch.

However, in general, the detection result error can be greater because the reflection would be generated when the light source illuminates the finger, and the reflected light from various directions and at various angles can enter into the sensing element.

SUMMARY

The present application aims to provide a display panel and a manufacturing method therefor.

The present application discloses a manufacturing method for a display panel, including steps of:

forming a photosensitive element layer;

forming a light collimating layer on the photosensitive element layer; and forming an active light-emitting matrix layer on the light collimating layer;

where the step of forming a light collimating layer on the photosensitive element layer includes:

providing a metal substrate; and putting the metal substrate into an electrolyte, and preparing a porous oxidized metal as the light collimating layer by a two-step oxidation method.

The present application also discloses a manufacturing method for a display panel, including steps of:

forming a photosensitive element layer;

forming a light collimating layer on the photosensitive element layer; and forming an active light-emitting matrix layer on the light collimating layer;

where the step of forming a light collimating layer includes:

providing an aluminum substrate, putting the aluminum substrate into ethanol, and carrying out ultrasonic oscillation for a first preset time;

taking out the aluminum substrate, annealing the metal substrate in an oven at a preset temperature for a second preset time, and taking out the metal substrate after cooling; and putting the aluminum substrate into an electrolyte, and preparing a porous alumina as the light collimating layer by a two-step oxidation method.

The present application also discloses a display panel formed by the manufacturing method for a display panel described above, and the display panel includes: a photosensitive element layer; a light collimating layer formed on the photosensitive element layer; and an active light-emitting matrix layer formed on the light collimating layer; where the light collimating layer is a porous oxidized metal.

Compared with a solution where reflected light in various directions all can enter into the photosensitive element layer, in the present application, the active light-emitting matrix layer is located above the light collimating layer, and the photosensitive element layer is located below the light collimating layer; when the active light-emitting matrix layer emits light toward a direction away from the light collimating layer, if the light is hindered by a finger (and the like) and then reflected, the light collimating layer filters some of the reflected light when the light passes through it, allowing only the light within a certain angle range passes, and thereby causing the light received by the photosensitive element layer more eligible and the detection result more accurate, which facilitates to improve performance of the display panel.

BRIEF DESCRIPTION OF DRAWINGS

The accompanying drawings, which are included to provide a further understanding of embodiments of the present application and constitute a part of the specification, illustrate embodiments of the present application and, together with the text description, explain the principles of the present application. Obviously, the drawings in the following description are merely some embodiments of the present application, and those skilled in the art can obtain other drawings according to the drawings without any inventive labor. In the drawings.

DETAILED DESCRIPTION OF EMBODIMENTS

Figure 1:
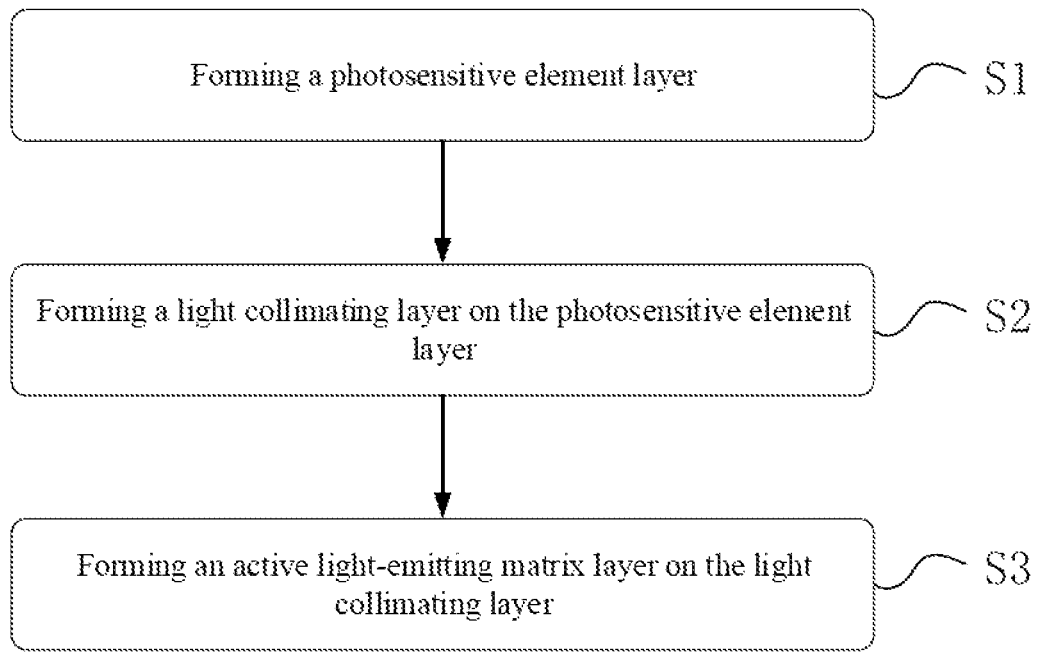
FIG. 1 is a schematic flowchart of a manufacturing method for a display panel according to an embodiment of the present application.

It should be understood that the terminology, specific structural and functional details disclosed are merely exemplary for the purpose of describing specific embodiments. However, the present application may be embodied in many alternative forms and should not be construed as being limited to the embodiments set forth herein.

In the description of the present application, the terms "first" and "second" are only for the purpose of description and cannot be construed to indicate relative importance or imply an indication of the number of technical features indicated. Therefore, unless otherwise stated, a feature defined as "first" and "second" may explicitly or implicitly include one or more of the features; "multiple" means two or more. The term "include" and any variations thereof are intended to be inclusive in a non-closed manner, that is, the presence or addition of one or more other features, integers, steps, operations, units, components and/or combinations thereof may be possible.

In addition, the terms "center", "horizontally", "up", "down". "left", "right", "vertical", "horizontal", "top", "bottom", "inner", "outer" and the like for indicating an orientation or positional relationship are based on the description of the orientation or relative positional relationship shown in the accompanying drawings, and are only simplified description facilitating description of the application, and are not intended to indicate that the device or element referred to must have a particular orientation, be configured and operated in a particular orientation, and therefore cannot be construed as limiting the present application.

In addition, unless expressly specified and defined otherwise, the terms "mount", "attach" and "connect" are to be understood broadly. For example, it can be a fixed connection, a detachable connection, or an integral connection; it can be an either mechanical connection or an electrical connection; it can be a direct connection or an indirect connection through an intermediate medium, or an internal connection between two elements. For those skilled in the art, the specific meaning of the above terms in the present application can be understood according to the specific circumstances.

The present application will now be described in details by reference to the accompanying drawings and optional embodiments.

A display panel of the present application is an Organic Light-Emitting Diode (OLED) display panel, and is a display panel with an optical fingerprint identification function. In a process of optical fingerprint identification, reflected light at various angles is generated because reflection generated by a finger is diffuse reflection, and thus much ineligible reflected light enters into a photosensitive element, thereby causing identification error, and the fact that a fingerprint pattern is small adds to the influence of this error, which may thereby cause erroneous judgment.

The present application will now be described in details by reference to the accompanying drawings and optional embodiments.

Figure 2:
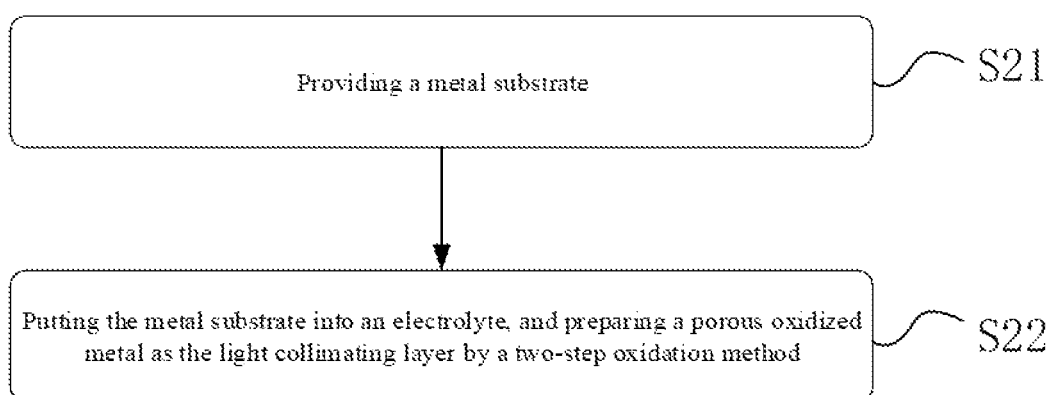
FIG. 2 is a schematic flowchart of a manufacturing method for a light collimating layer according to an embodiment of the present application.
Figure 3:
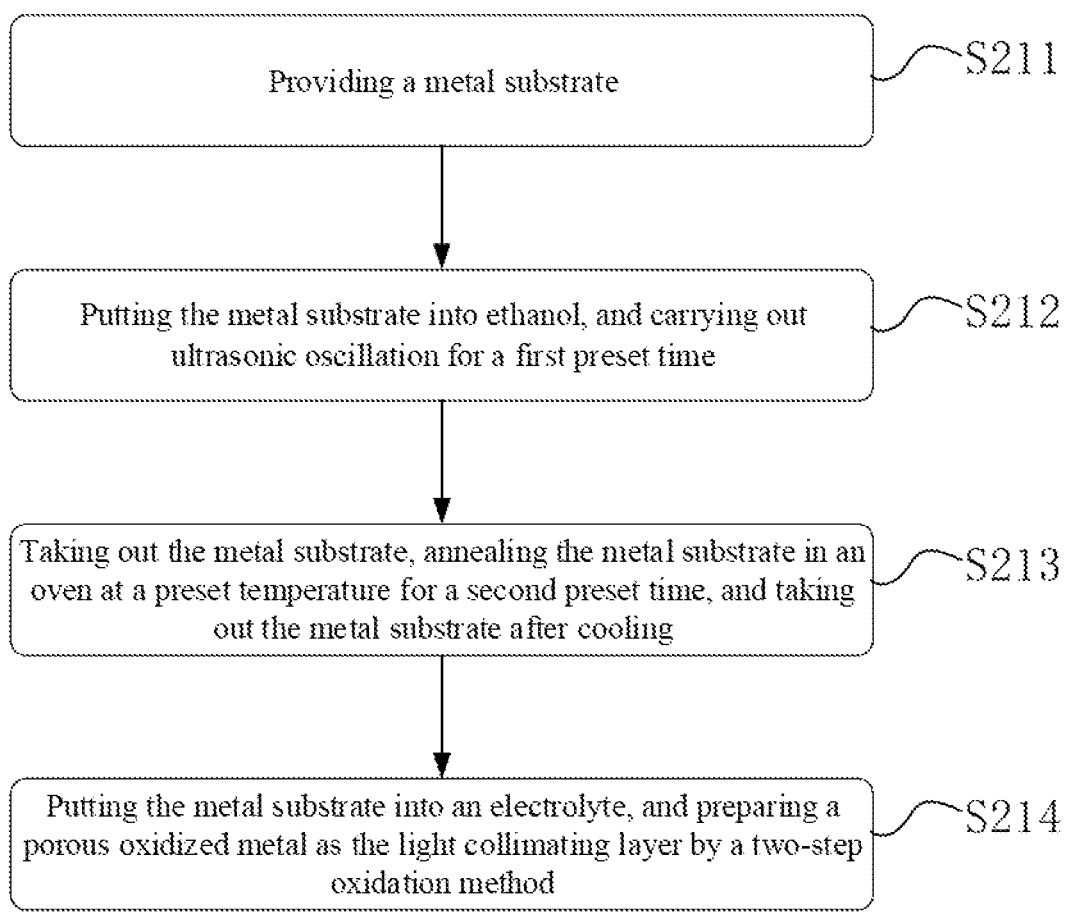
FIG. 3 is a schematic flowchart of a manufacturing method for a light collimating layer according to another embodiment of the present application.

As shown in FIGS. 1 to 3, the present application discloses a manufacturing method for a display panel, including steps of:

S1: forming a photosensitive element layer;
S2: forming a light collimating layer for filtering light on the photosensitive element layer; and
S3: forming an active light-emitting matrix layer on the light collimating layer; where the step of forming a light collimating layer on the photosensitive element layer includes:
S21: providing a metal substrate; and
S22: putting the metal substrate into an electrolyte, and preparing a porous oxidized metal as the light collimating layer by a two-step oxidation method.

Compared with a solution where reflected light in various directions all can enter into the photosensitive element layer, in the present application, the active light-emitting matrix layer is located above the light collimating layer, and the photosensitive element layer is located below the light collimating layer; when the active light-emitting matrix layer emits light toward a direction away from the light collimating layer, if the light is hindered by a finger (and the like) and then reflected, the light collimating layer filters some of the reflected light when the light passes through it, allowing only the light within a certain angle range passes, and thereby causing the light received by the photosensitive element layer more eligible and the detection result more accurate, which facilitates to improve performance of the display panel.

The light collimating layer includes a plurality of through pores perpendicular to the photosensitive element layer and having uniform gaps therebetween; the through pores are light transmission regions capable of filtering light to be detected into parallel light or quasi-parallel light, and regions of the light collimating layer except the through pores are non-light transmission regions capable of filtering light at other angles; the light collimating layer, on one hand, can effectively guarantee that the OLED display panel can show information normally, and on the other hand guarantees that the photosensitive element can receive the light to be detected more accurately, causing the light received by the photosensitive element more eligible and the detection result more accurate; meanwhile, the manufacture procedure of the light collimating layer of the present application is simple and has many advantages such as even pore height, unified pore diameter, controllable pore shape, and large surface area, so the light collimating layer is applicable to optical identification.

Specifically, before the step of putting the metal substrate into an electrolyte and preparing a porous oxidized metal as the light collimating layer by a two-step oxidation method, the method further includes steps of:

S221: putting the metal substrate into ethanol, and carrying out ultrasonic oscillation for a first preset time; and
S222: taking out the metal substrate, annealing the metal substrate in an oven at a preset temperature for a second preset time, and taking out the metal substrate after cooling.

Putting the metal substrate into ethanol may remove oil stains, and subsequent carrying out of ultrasonic oscillation for a duration of time may remove the impurities stained on the metal substrate, so that a cleaner metal substrate is obtained, and the yield of the manufacture procedure can be facilitated.

In one or more embodiments, a large amount of experimental data show that the first preset time is 3-6 minutes, the second preset time is 1-3 hours, and the preset temperature is 400-600° C., and particularly, both the productivity and the yield are high when the first preset time is 5 minutes, the second preset time is 2 hours, and the preset temperature is 500° C.

A material of the metal substrate of the present application is high-purity aluminum, and the purity of 99.99% or greater is better, because the higher the purity is, the more uniform the pores will be when forming a porous structure.

Specifically, the electrolyte includes any one of phosphoric acid, oxalic acid and sulfuric acid. The electrolysis is a process for dissolving the alumina prepared by anodic oxidation, and the hydrogen ion ionization capacities of the electrolytes are different, so that the required concentrations are different. The phosphoric acid has a concentration of 0.1-0.5 mol/L, the oxalic acid has a concentration of 0.2-0.8 mol/L. and the sulfuric acid has a concentration of 0.2-0.6 mol/L; when the concentration is higher, a pore diameter formed will be relatively larger; however, when the concentration is too high, pores will be penetrated and connected, causing the absence of an ordered porous structure of the porous oxidized metal prepared.

Further, the current density of the electrolysis is 1-35 A/cm², and the optional current density is 1-10 A/cm²; for the electrolysis of the metal substrate in the present application, the larger the current density, the larger the voltage, and the larger the pore diameter prepared.

Specifically, after the aluminum substrate is put into the electrolyte, with the aluminum substrate used as an anode and graphite used as a cathode, oxidation reaction is carried out on the aluminum substrate twice to obtain porous alumina; in another embodiment, the pore diameter can be expanded by a pore expansion step as needed, and the pore diameter can be further adjusted by phosphoric acid, so that nanopores having same gaps therebetween and similar in size in both the front side and the back side are obtained.

In a specific embodiment, the aluminum substrate with a purity of 99.99% is put into ethanol and subjected to ultrasonic oscillation for 5 minutes to remove oil stains thereon; then the aluminum substrate is taken out and annealed in an oven at 500° C. for 2 hours; the aluminum substrate is then put into an oxalic acid solution with a concentration of 0.4 mol/L after cooling and electrolytic current with a current density of 1.5 A/cm² is provided, and a porous alumina is prepared by the two-step oxidation method, and the pores have a pore diameter of 20 μm after expanding treatment.

In a specific embodiment, the aluminum substrate with a purity of 99.99% is put into ethanol and subjected to ultrasonic oscillation for 5 minutes to remove oil stains thereon; then the aluminum substrate is taken out and annealed in an oven at 500° C. for 2 hours; the aluminum substrate is then put into a sulfuric acid solution with a concentration of 0.6 mol/l after cooling and electrolytic current with a current density of 2.0 A/cm² is provided, and a porous alumina is prepared by the two-step oxidation method, and the pores have a pore diameter of 30 μm.

In a specific embodiment, the aluminum substrate with a purity of 99.99% is put into ethanol and subjected to ultrasonic oscillation for 5 minutes to remove oil stains thereon; then the aluminum substrate is taken out and annealed in an oven at 500° C. for 2 hours; the aluminum substrate is then put into a phosphoric acid solution with a concentration of 0.4 mol/L after cooling and electrolytic current with a current density of 5.0 A/cm² is provided, and a porous alumina is prepared by the two-step oxidation method, and the pores have a pore diameter of 40 um.

It should be noted that the electrolyte, the concentration of the electrolyte and the current density of the electrolysis selected above are not required to be in one-to-one correspondence, and they can be freely combined and selected to produce the porous alumina with different pore diameters under different conditions.

Figure 4:
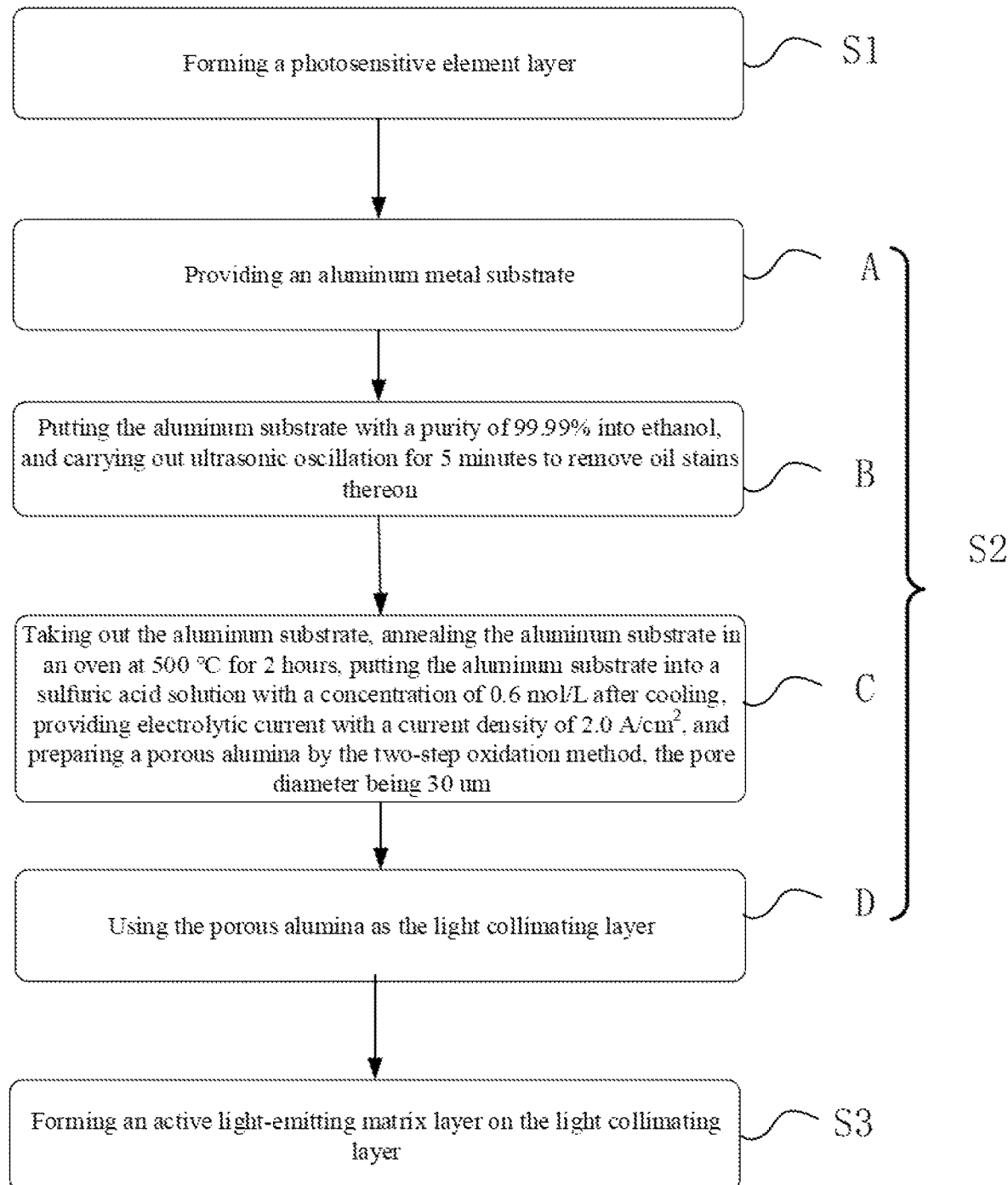
FIG. 4 is a schematic flowchart of a manufacturing method for a light collimating layer according to another embodiment of the present application.

As shown in FIG. 4, the present application also discloses a manufacturing method for a display panel, including steps of:

S1: forming a photosensitive element layer;
S2: forming a light collimating layer for filtering light on the photosensitive element layer; and
S3: forming an active light-emitting matrix layer on the light collimating layer;

where the step of forming a light collimating layer on the photosensitive element layer includes:

A: providing an aluminum metal substrate;
B: putting the aluminum substrate with a purity of 99.99% into ethanol, and carrying out ultrasonic oscillation for 5 minutes to remove oil stains thereon;
C: taking out the aluminum substrate, annealing the aluminum substrate in an oven at 500° C. for 2 hours, putting the aluminum substrate into a sulfuric acid solution with a concentration of 0.6 mol/L after cooling, providing electrolytic current with a current density of 2.0 A/cm², and preparing a porous alumina by the two-step oxidation method, the pore diameter being 30 um; and
D: using the porous alumina as the light collimating layer.

In the display panel of the present application, the active light-emitting matrix layer is located above the light collimating layer, and the photosensitive element layer is located below the light collimating layer; when the active light-emitting matrix layer emits light toward a direction away from the light collimating layer, if the light is hindered by a finger (and the like) and then reflected, the light collimating layer filters some of the reflected light when the light passes it, allowing only the light within a certain angle range passes, and thereby causing the light received by the photosensitive element layer more eligible and the detection result more accurate, which facilitates to improve performance of the display panel; besides, the light collimating layer is the porous alumina with a smaller pore diameter of 30 um, which is beneficial for filtering the light, and the pores of the porous alumina manufactured are characterized by uniform distribution and unified pore diameters and they are through pores perpendicular to the photosensitive element layer, which is also beneficial for filtering the light.

Figure 5:
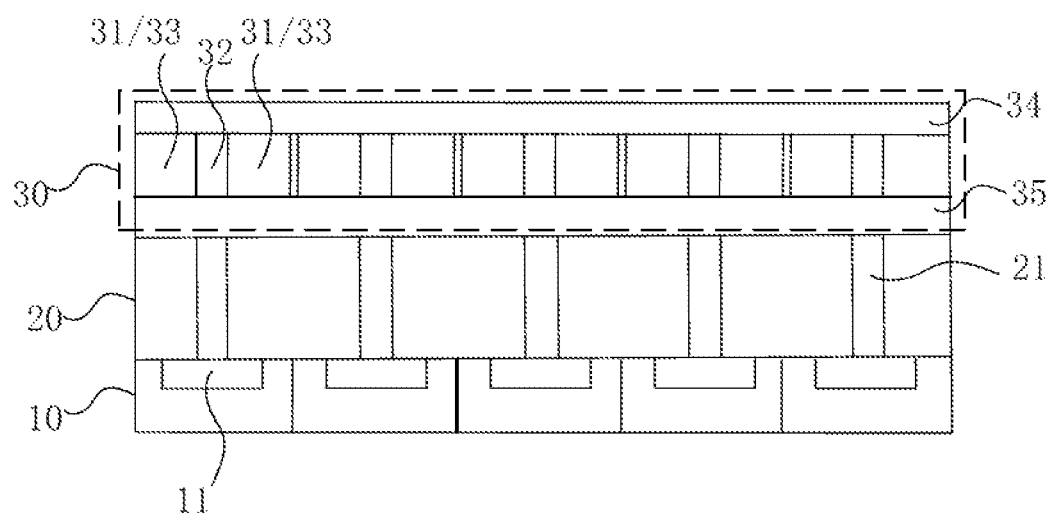
FIG. 5 is a schematic diagram of a display panel according to an embodiment of the present application.

As shown in FIG. 5, as another embodiment of the present application, a display panel formed by the manufacturing method for a display panel described above is disclosed, and the display panel includes: a photosensitive element layer 10, a light collimating layer 20 formed on the photosensitive element layer 10, and an active light-emitting matrix layer 30 formed on the light collimating layer 20, where the light collimating layer 20 is porous oxidized metal. In the display panel of the present application, the active light-emitting matrix layer is located above the light collimating layer, and the photosensitive element layer is located below the light collimating layer; when the active light-emitting matrix layer emits light toward a direction away from the light collimating layer, if the light is hindered by a finger (and the like) and then reflected, the light collimating layer filters some of the reflected light when the light passes through it, allowing only the light within a certain angle range passes, and thereby causing the light received by the photosensitive element layer more eligible and the detection result more accurate, which facilitates to improve performance of the display panel.

In the present application, the light emitted from the active light-emitting matrix layer 30, after being reflected back from a contact interface with a fingerprint, is adjusted by the light collimating layer 20 to become parallel light or quasi-parallel light, which is more beneficial to obtaining a clear and high-quality fingerprint image.

It should be noted that, the total thickness of the active light-emitting matrix layer 30 and the light collimating layer 20 of the present application is less than 5 mm, and thus the light collimating layer 20 can function better. In the fingerprint identification, a fingerprint pattern is small, and reflected light at various angles is generated when the light emitted by the active light-emitting matrix layer 30 is reflected back by the finger, if the reflected light is reflected into the photosensitive element after a long path, light difference may be weak and identification capability may be insufficient, while if the reflected path is shorter, the intensity difference of the reflected light is greater; the light returned to the active light-emitting matrix layer is filtered into parallel light or quasi-parallel light so that the crossing and intervention of the reflected light between the surfaces is less likely, so the thicknesses of the active light-emitting matrix layer 30 and the light collimating layer 20 can be selected in a larger range. However, considering the size of a final structure and the weight of a product, the total thickness of the active light-emitting matrix layer 30 and the light collimating layer 20 is controlled to be less than 5 mm, and further, the light collimating layer 20 has a thickness of 70-500 um and a pore length of 70-500 um.

In a specific embodiment, the aluminum substrate with a purity of 99.99% is put into ethanol and subjected to ultrasonic oscillation for 5 minutes to remove oil stains thereon; then the aluminum substrate is taken out and annealed in an oven at 500° C. for 2 hours; the aluminum substrate is then put into an oxalic acid solution with a concentration of 0.4 mol/L after cooling and electrolytic current with a current density of 1.5 A/cm$^2$ is provided, and a porous alumina is prepared by the two-step oxidation method, and the pores of the formed porous alumina have a length of 20 um.

Specifically, the photosensitive element layer 10 includes a plurality of photosensitive elements 11, the plurality of photosensitive elements 11 are disposed in an array, and the light collimating layer 20 includes a plurality of through pores 21 disposed in one-to-one correspondence with the plurality of photosensitive elements 11; the active light-emitting matrix layer 30 includes non-light transmission regions 31 and light transmission regions 32, and the non-light transmission regions 31 include light-emitting circuits 33; the active light-emitting matrix layer 30 further includes a first transparent layer 34 and a second transparent layer 35, the light-emitting circuits are disposed between the first transparent layer 34 and the second transparent layer 35, and the plurality of through pores 21 are disposed in one-to-one correspondence with the plurality of light transmission regions 32; the light transmission regions 32 and the non-light transmission regions 31 of the active light-emitting matrix layer 30 can serve to filter the light preliminarily, and can further filter light by cooperating with the through pores 21 of the light collimating layer 20.

Different from the previous embodiment, a plurality of photosensitive elements 11 are disposed correspondingly for one through pore 21; the presence of more photosensitive elements 11 means more photosensitive elements in an unit area and thus light identification degree is higher, which may improve optical identification resolution, and in terms of optical fingerprint identification, may further improve identification accuracy.

It should be noted that, the limitation of the steps involved in this solution, without affecting the implementation of the specific solution, is not determined to limit the sequence of steps, and the previous steps may be executed first, later, or even simultaneously. Any sequence shall be deemed to fall within the scope of the present application as long as the solution can be implemented.

The above content is a further detailed description of the present application in conjunction with specific optional embodiments, and it is not to be construed that specific embodiments of the present application are limited to these descriptions. For those of ordinary skill in the art to which the present application belongs, a number of simple derivations or substitutions may be made without departing from the spirit of the present application, all of which shall be deemed to fall within the scope of the present application.

What is claimed is:

1. A manufacturing method for a display panel, comprising steps of:
   forming a photosensitive element layer;
   forming a light collimating layer on the photosensitive element layer; and
   forming an active light-emitting matrix layer on the light collimating layer;
   wherein the step of forming a light collimating layer on the photosensitive element layer comprises:
   providing a metal substrate; and
   putting the metal substrate into an electrolyte, and preparing a porous oxidized metal as the light collimating layer by a two-step oxidation method;
   wherein before the step of putting the metal substrate into an electrolyte and preparing a porous oxidized metal as the light collimating layer by a two-step oxidation method, the method further comprises steps of:
   putting the metal substrate into ethanol, and carrying out ultrasonic oscillation for a first preset time; and
   taking out the metal substrate, annealing the metal substrate in an oven at a preset temperature for a second preset time, and taking out the metal substrate after cooling.

2. The manufacturing method for a display panel according to claim 1, wherein the first preset time is 3-6 minutes, the second preset time is 1-3 hours, and the preset temperature is 400-600° C.

3. The manufacturing method for a display panel according to claim 1, wherein the electrolyte comprises any one of phosphoric acid, oxalic acid and sulfuric acid.

4. The manufacturing method for a display panel according to claim 3, wherein the phosphoric acid has a concentration of 0.1-0.5 mol/L, the oxalic acid has a concentration of 0.2-0.8 mol/L, and the sulfuric acid has a concentration of 0.2-0.6 mol/L.

5. The manufacturing method for a display panel according to claim 1, wherein the current density of the electrolysis is 1-35 A/cm'.

6. The manufacturing method for a display panel according to claim 1, wherein the metal substrate comprises an aluminum substrate, the aluminum substrate has a purity of 99.99% or greater, and the porous oxidized metal comprises a porous alumina.

7. A manufacturing method for a display panel, comprising steps of:
   forming a photosensitive element layer;
   forming a light collimating layer on the photosensitive element layer; and
   forming an active light-emitting matrix layer on the light collimating layer;
   wherein the step of forming a light collimating layer comprises:
   providing an aluminum substrate, putting the aluminum substrate into ethanol, and carrying out ultrasonic oscillation for 5 minutes;
   taking out the aluminum substrate, annealing the aluminum substrate in an oven at 500° C. for 2 hours, and taking out the aluminum substrate after cooling; and
   putting the aluminum substrate into an electrolyte, and preparing a porous alumina as the light collimating layer by a two-step oxidation method.

8. The manufacturing method for a display panel according to claim 7, wherein the electrolyte comprises any one of phosphoric acid, oxalic acid and sulfuric acid.

9. The manufacturing method for a display panel according to claim 8, wherein the phosphoric acid has a concentration of 0.1-0.5 mol/L, the oxalic acid has a concentration of 0.2-0.8 mol/L, and the sulfuric acid has a concentration of 0.2-0.6 mol/L.

10. The manufacturing method for a display panel according to claim 8, wherein the current density of the electrolysis is 1-10 A/cm$^2$.

11. A display panel, comprising:
a photosensitive element layer;
a light collimating layer formed on the photosensitive element layer; and
an active light-emitting matrix layer formed on the light collimating layer;
wherein the light collimating layer is a porous oxidized metal;
wherein the light collimating layer comprises a plurality of through pores perpendicular to the photosensitive element layer, the photosensitive element layer comprises a plurality of photosensitive elements, and the photosensitive elements are disposed in one-to-one correspondence with the through pores;
wherein the active light-emitting matrix layer comprises non-light transmission regions and light transmission regions, the light transmission regions comprise light-emitting circuits, the active light-emitting matrix layer further comprises a first transparent layer and a second transparent layer, the light-emitting circuits are disposed between the first transparent layer and the second transparent layer, and the plurality of through pores are disposed in one-to-one correspondence with the plurality of light transmission regions.

12. The display panel according to claim 11, wherein each through pore has a pore diameter of 10-70 um and a pore depth of 70-500 μm.

13. The display panel according to claim 11, wherein the plurality of through pores have uniform gaps therebetween, wherein the through pores are light transmission regions capable of filtering light to be detected into parallel light or quasi-parallel light, and regions of the light collimating layer except the through pores are non-light transmission regions.

14. The display panel according to claim 11, wherein a total thickness of the active light-emitting matrix layer and the light collimating layer is less than 5 mm.

15. The display panel according to claim 11, wherein the light collimating layer has a thickness of 70-500 μm.

* * * * *